US011185929B2

United States Patent
Akesson et al.

(10) Patent No.: US 11,185,929 B2
(45) Date of Patent: *Nov. 30, 2021

(54) COATED CUTTING TOOL

(71) Applicant: SANDVIK INTELLECTUAL PROPERTY AB, Sandviken (SE)

(72) Inventors: Leif Akesson, Alvsjo (SE); Anders Stenberg, Hagersten (SE); Carl-Johan Maderud, Stockholm (SE); Susanne Norgren, Huddinge (SE); Elias Forssbeck Nyrot, Uppsala (SE); Ake Ostlund, Hagersten (SE); Jan Engqvist, Uppsala (SE)

(73) Assignee: SANDVIK INTELLECTUAL PROPERTY AB, Sandviken (SE)

(*) Notice: Subject to any disclaimer, the term of this patent is extended or adjusted under 35 U.S.C. 154(b) by 191 days.

This patent is subject to a terminal disclaimer.

(21) Appl. No.: 16/487,132

(22) PCT Filed: Feb. 27, 2018

(86) PCT No.: PCT/EP2018/054800
§ 371 (c)(1),
(2) Date: Aug. 20, 2019

(87) PCT Pub. No.: WO2018/158245
PCT Pub. Date: Sep. 7, 2018

(65) Prior Publication Data
US 2021/0138556 A1    May 13, 2021

(30) Foreign Application Priority Data
Feb. 28, 2017  (EP) ..................................... 17158416

(51) Int. Cl.
*B23B 27/14* (2006.01)
*C23C 28/04* (2006.01)

(52) U.S. Cl.
CPC ............ *B23B 27/14* (2013.01); *C23C 28/044* (2013.01); *B23B 2224/24* (2013.01); *B23B 2224/32* (2013.01); *B23B 2224/36* (2013.01)

(58) Field of Classification Search
CPC ....... B23B 27/14; B23B 27/148; C23C 16/36; C23C 16/403
(Continued)

(56) References Cited

U.S. PATENT DOCUMENTS 7,192,660 B2 * 3/2007 Ruppi .................. C23C 30/005
428/698
9,463,513 B2 * 10/2016 Ostlund ................ B23B 27/148
(Continued)

FOREIGN PATENT DOCUMENTS

EP     2032731 A1    3/2009
EP     2607512 A1    6/2013
(Continued)

OTHER PUBLICATIONS

Igor Konyashin et al: "1.15 Cemented Carbides for Mining, Construction and Wear Parts", Reference Module in Materials Science and Materials Engineering Comprehensive Hard Materials, Amsterdam: Elsevier, 2014-NL, pp. 425-451, Jan. 1, 2014.

*Primary Examiner* — Archene A Turner
(74) *Attorney, Agent, or Firm* — Corinne R. Gorski

(57) ABSTRACT

A coated cutting tool of a cemented carbide substrate made of WC, a metallic binder phase and a gamma phase has a well distributed gamma phase and a reduced amount of abnormal WC grains. Further, the coated cutting tool is provided with a CVD coating of TiCN and an $\alpha\text{-}Al_2O_3$ layer, wherein the $\alpha\text{-}Al_2O_3$ layer exhibits a texture coefficient TC(0 0 12)≥7.2 and wherein in the ratio I(0 0 12)/I(0 1 14)≥1. The coated cutting tool has an increased resistance against plastic deformation. whilst maintaining toughness.

11 Claims, 1 Drawing Sheet

(58) Field of Classification Search
USPC .......... 51/307, 309; 428/336, 698, 701, 702
See application file for complete search history.

(56) References Cited

U.S. PATENT DOCUMENTS

| | | |
|---|---|---|
| 2002/0114981 A1 | 8/2002 | Andersson et al. |
| 2005/0126336 A1 | 6/2005 | Jansson et al. |
| 2014/0308083 A1* | 10/2014 | Bjormander .............. B23C 5/16 |
| | | 407/119 |
| 2015/0063930 A1 | 3/2015 | Hedin et al. |
| 2016/0136786 A1* | 5/2016 | Bjormander .......... C23C 30/005 |
| | | 51/309 |
| 2016/0175940 A1* | 6/2016 | Lindahl ................. C23C 28/044 |
| | | 428/141 |

FOREIGN PATENT DOCUMENTS

| | | |
|---|---|---|
| EP | 3034653 A1 | 6/2016 |
| WO | 00/03048 A1 | 1/2000 |

* cited by examiner

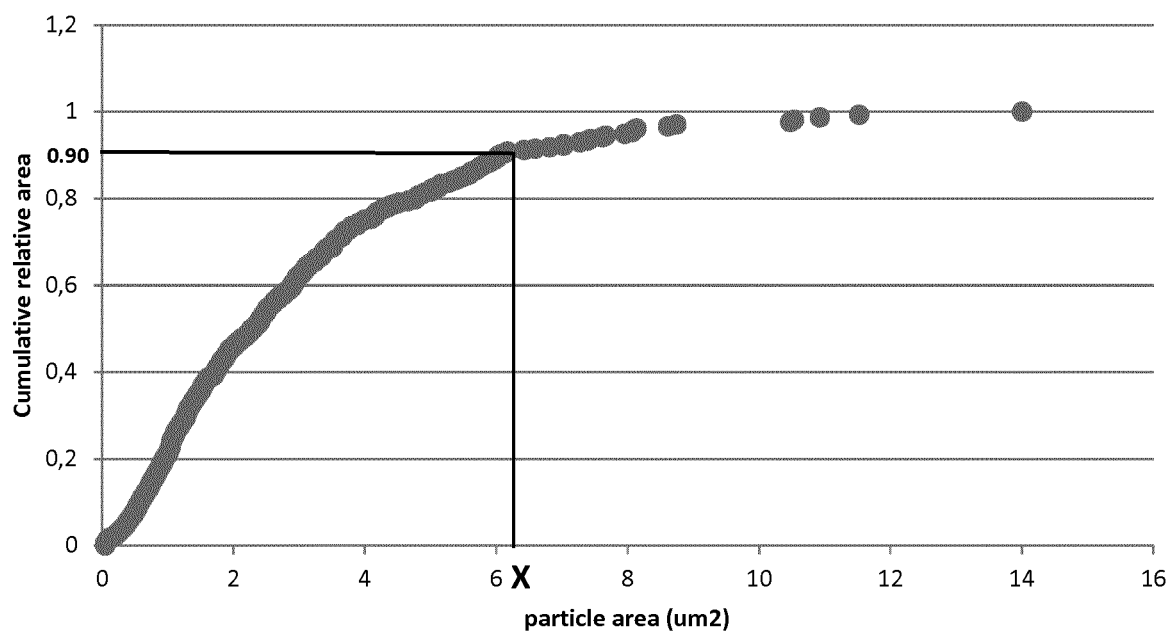

COATED CUTTING TOOL

RELATED APPLICATION DATA

This application is a § 371 National Stage Application of PCT International Application No. PCT/EP2018/054800 filed Feb. 27, 2018 claiming priority to EP 17158416.2 filed Feb. 28, 2017.

The present invention relates to a coated cutting tool for chip forming machining of metals comprising a substrate and a coating where the coated turning insert are particularly suitably for machining steel.

BACKGROUND

Cutting tools with cemented carbide substrates having a binder phase enriched surface zone depleted of gamma phase provided with a CVD coating are well known in the art in turning operations.

However, there is always an ongoing strive to improve the performance of cutting tools such as inserts. A longer tool life leads to reduction of production costs etc.

Plastic deformation is one of the wear mechanisms in cutting operations. Usually when trying to improve the resistance against plastic deformation, the toughness of the substrate is reduced.

One object of the present invention is to achieve an improved resistance against plastic deformation while maintaining the same toughness.

Another object of the present invention is to achieve an improved resistance against plastic deformation while at the same time improving the toughness.

DESCRIPTION OF DRAWINGS

FIG. 1 show a cumulative plot where the cumulative relative area (y-axis), is plotted against the particle area (x-axis).

DETAILED DESCRIPTION OF THE PRESENT INVENTION

The present invention relates to a coated cutting tool comprising a cemented carbide substrate and a coating. The cemented carbide substrate comprises WC, a cobalt binder phase and gamma phase wherein the cemented carbide substrate comprises a binder phase enriched surface zone depleted of gamma phase where the thickness of the surface zone is between 14 and 26 µm, and where the cemented carbide has a well distributed gamma phase so that N is less than 80 µm², where $$N = X/Y$$

where X (µm²) is the particle area (x-axis) at the cumulative relative area of 0.90 (y-axis), in a cumulative plot, obtained from EBSD analysis, where the cumulative relative particle area of the gamma phase particles (y-axis) is plotted against the particle area (x-axis).

Y is a correction factor $$Y = \frac{\text{area fraction of cubic carbides and cubic carbonitrides}}{\text{area fraction of total carbides and carbonitrides}}$$

where the area fractions are obtained from EBSD analysis.

Further, the area fraction of abnormal WC grains obtained from EBSD analysis defined as $$\text{area fraction abnormal grains} = \frac{\text{total area of all } WC \text{ grains} > 10 \times aWC_{av}}{\text{total area of all } WC \text{ grains}}$$

is between 0 and 0.03.

The coating comprises a α-Al$_2$O$_3$ layer and between said substrate and said α-Al$_2$O$_3$ layer the coating comprises a TiCN-layer, wherein said α-Al$_2$O$_3$ layer exhibits a texture coefficient TC(hkl), as measured by X-ray diffraction using CuKα radiation and θ-2θ scan, defined according to Harris formula $$TC(hkl) = \frac{I(hkl)}{I_0(hkl)} \left[ \frac{1}{n} \sum_{n=1}^{n} \frac{I(hkl)}{I_0(hkl)} \right]^{-1}$$

where I(hkl) is the measured intensity (integrated area) of the (hkl) reflection, I$_0$(hkl) is the standard intensity according to ICDD's PDF-card No. 00-010-0173, n is the number of reflections used in the calculation, and where the (hkl) reflections used are (1 0 4), (1 1 0), (1 1 3), (024), (1 1 6), (2 1 4), (3 0 0) and (0 0 12) characterized in that TC(0 0 12)≥7.2 and wherein the ratio of I(0 0 12)/I(0 1 14)≥1.

The characterization of the cemented carbide according to the present invention is performed using Electron backscatter diffraction (EBSD). EBSD is an SEM method that steps the beam across the sample surface by a defined distance (the step size) and determines the phase and crystallographic orientation of the sample at each step from the diffraction pattern produced when the sample is tilted at 70° to the horizontal. This information can be used to produce maps of the sample microstructure which can be easily evaluated using the crystallographic information to determine the size and relative location of grain boundaries, phases and grains.

The cemented carbide should have as few abnormal WC grains as possible. By an abnormal WC grain is usually meant a WC grain that is several times larger than the average WC grain size. The amount of abnormal WC grains herein is determined from EBSD analysis of the cemented carbide material.

The area fraction of abnormal WC grains is defined as the area fraction of the WC grains that is larger than 10 times the average area for the WC grains, aWC$_{av}$, related to the total area of WC grains.

$$\text{area fraction abnormal grains} = \frac{\text{total area of all } WC \text{ grains} > 10 \times aWC_{av}}{\text{total area of all } WC \text{ grains}}$$

According to the present invention the area fraction of abnormal grains is from 0 to 0.03, preferably from 0 to 0.025, more preferably from 0 to 0.02.

The gamma phase, which is a solid solution of cubic carbides and/or carbonitrides, is formed during sintering from cubic carbides and/or carbonitrides and WC and can be described as (W,M)C or (W,M)(C,N) wherein M is one or more of Ti, Ta, Nb, Hf, Zr, Cr and V.

In one embodiment of the present invention, the cemented carbide comprises NbC in an amount of 0.5 to 2.5 wt %, preferably 1 to 1.5 wt %. Further, the cemented carbide comprises TaC in an amount of 2.5 to 4.5 wt %, preferably 3 to 4 wt %. Further, the cemented carbide comprises TiC in an amount of 1.8 to 3.3 wt %, preferably 2 to 3 wt %.

The amount of gamma phase is suitably from 3 to 25 vol %, preferably from 5 to 17 vol %. This can be measured in different ways e.g. by making an image analysis of either a Light Optical Microscope (LOM) image or a Scanning Electron Microscope (SEM) micrograph of a cross section of the substrate to calculate the average fraction of gamma phase. When the cemented carbide is provided with a gradient in the surface zone, the amount of gamma phase as given herein is measured in the bulk. The amount of gamma phase can also be retrieved from EBSD analysis.

The distribution of gamma phase should be as even as possible. The EBSD analysis of the gamma phase has been performed on the gamma phase particles, i.e. not the gamma phase grains. Through processing the EBSD data it is possible to choose if particles or grains should be measured. By grain is herein meant a single crystal whereas a particle contains 2 or more grains in direct contact with each other.

According to the present invention, the gamma phase is well distributed with a controlled particle size.

The distribution of the gamma phase is determined by EBSD analysis and is given by the value N, where:

$N = X/Y$

The cumulative relative particle area of the gamma phase particles (y-axis) from the EBSD analysis is plotted against the particle area (x-axis). See FIG. 1. From the cumulative plot (0 to 1), the particle area (x-axis) at the cumulative relative area of 0.90 (y-axis), value X ($\mu m^2$), is achieved. If no value matches 0.90 exactly, an average of the two values below and above 0.90 is used as X.

The value Y is a correction factor to correlate for different amounts of gamma phase in the cemented carbide. Y is the ratio between the area fraction of cubic carbides and cubic carbonitrides (gamma phase) divided by the total amount of carbides and carbonitrides, i.e. both WC (hexagonal) and gamma phase (cubic). The area fractions are obtained from the EBSD data.

$$Y = \frac{\text{area fraction of cubic carbides and cubic carbonitrides}}{\text{area fraction of total carbides and carbonitrides}}$$

According to the present invention the gamma phase distribution, N, is suitably less than 80 $\mu m^2$, preferably from 15 to 75 $\mu m^2$ more preferably from 35 to 70 $\mu m^2$.

The thickness of the surface zone is suitably between 10 to 35 $\mu m$, preferably between 14 to 26 $\mu m$. The thickness is measured between the surface of the substrate and the border between the gamma phase containing bulk and the surface zone which is depleted from gamma phase. In a SEM or LOM image this border is easy to identify since it is quite distinct. The measurements of the thickness of the surface zone should preferably be done on a flat surface, preferably on the flank face, not too close to the cutting edge. By that is herein meant that the measurements should be performed at least 0.3 mm from the cutting edge.

By binder enriched is herein meant that the binder phase content in the surface zone is at least 1.3 times the binder phase content in the bulk. The binder phase content in the surface zone is suitably measured at a depth of half the total thickness/depth of the surface zone. By bulk is herein defined as the area that is not the surface zone. All measurements performed on the bulk should be performed at an area not too close to the surface zone. By that is herein meant that any measurements done to the microstructure of the bulk should be performed at a depth of at least 100 $\mu m$ from the surface.

By depleted of gamma phase is herein meant that the surface zone contains no, or very few gamma phase particles.

The amount of cobalt is between 5 to 17 wt %, suitably between 8 to 12 wt % of the sintered body.

In one embodiment of the present invention, when Cr is present in the cemented carbide, some of the Cr is dissolved in the binder phase.

The cemented carbide can also comprise other constituents common in the art of cemented carbides. When recycled material (PRZ) is used, that Zr, V, Zn, Fe, Ni and Al can also be present in small amounts.

The coating according to the present invention comprises a $\alpha$-$Al_2O_3$ layer and between said substrate and said $\alpha$-$Al_2O_3$ layer the coating further comprises a TiCN-layer. The $\alpha$-$Al_2O_3$ exhibits a texture coefficient TC(hkl), as measured by X-ray diffraction using CuK$\alpha$ radiation and $\theta$-$2\theta$ scan, defined according to Harris formula $$TC(hkl) = \frac{I(hkl)}{I_0(hkl)} \left[ \frac{1}{n} \sum_{n=1}^{n} \frac{I(hkl)}{I_0(hkl)} \right]^{-1} \quad (1)$$

where I(hkl) is the measured intensity (integrated area) of the (hkl) reflection, $I_0$(hkl) is the standard intensity according to ICDD's PDF-card No. 00-010-0173, n is the number of reflections used in the calculation, and where the (hkl) reflections used are (1 0 4), (1 1 0), (1 1 3), (0 2 4), (1 1 6), (2 1 4), (3 0 0) and (0 0 12), wherein TC(0 0 12)≥7.2, preferably 7.4, more preferably 7.5, more preferably 7.6, most preferably 7.7, and preferably 8; and wherein the ratio of I(0 0 12)/I(0 1 14)≥1, preferably 1.5, more preferably 1.7, most preferably 2, wherein I(0 0 12) is the measured intensity (integrated area) of the 0 0 12 reflection and I(0 1 14) is the measured intensity (integrated area) of the 0 1 14 reflection. An $\alpha$-$Al_2O_3$ layer with such a high TC(0 0 12) in combination with a I(0 0 12) equal or larger than I(0 1 14) has shown to be advantageous as a layer on cutting tools due to its unexpectedly high crater and flank wear resistance.

The $\alpha$-$Al_2O_3$ layer is typically deposited with thermal CVD. HTCVD is herein defined as a CVD process within the temperature range 950-1050° C., and MTCVD within 800-950° C.

The $\alpha$-$Al_2O_3$ layer is covering at least the area of the cutting tool that is engaged in cutting in a cutting operation, covering at least the areas exposed for crater wear and/or flank wear. Alternatively the whole cutting tool can be coated with the $\alpha$-$Al_2O_3$ layer and/or with any further layers of the coating.

A strong <0 0 1> texture is herein meant a statistically preferred growth along the <0 0 1> crystallographic direction, i.e. the $\alpha$-$Al_2O_3$ grains grow with their (0 0 1) crystallographic plane parallel to the substrate surface more frequently than with other crystallographic planes parallel to the substrate surface. A means to express preferred growth along a<h k l> crystallographic direction is the texture coefficient TC (h k l) calculated using the Harris formula (formula (1) above) on the basis of a defined set of XRD reflections measured on the respective sample. The intensities of the XRD reflections are standardized using a JCPDF-card indicating the intensities of the XRD reflections of the same material, e.g. $\alpha$-$Al_2O_3$, but with random orientation, such as in a powder of the material. A texture coefficient TC (h k l)>1 of a layer of crystalline material is an indication that the grains of the crystalline material are oriented with their (h k l) crystallographic plane parallel to the substrate surface more frequently than in a random distribution, at least compared to the XRD reflections used in the Harris formula to determine the texture coefficient TC. The texture coefficient TC (0 0 12) is used herein to indicate preferred crystal growth along the <0 0 1> crystallographic direction. The (0 0 1) crystallographic plane is parallel to the (0 0 6) and (0 0 12) crystallographic planes in the α-Al$_2$O$_3$ crystallographic system.

In one embodiment of the present invention the thickness of the α-Al$_2$O$_3$ layer is 2-20 μm, preferably 2-10 μm, most preferably 3-7 μm.

The coating further comprises a TiCN layer, preferably MTCVD coated, located between the substrate and the α-Al$_2$O$_3$ layer. The grains of the TiCN layer are columnar. In one embodiment of the present invention the thickness of said TiCN layer is 4-20 μm, preferably 4-15 μm, most preferably 5-12 μm. By TiCN is herein meant a Ti(C$_x$,N$_{1-x}$) wherein $0.2 \leq x \leq 0.8$, preferably $0.3 \leq x \leq 0.7$, more preferably $0.4 \leq x \leq 0.6$. The C/(C+N) ratio of the TiCN can for example be measured with an electron micro probe analysis.

The coating further comprises a bonding layer comprising a TiN, TiCN, TiCNO and/or TiCO or a combination thereof, preferably TiCN and TiCNO, located outermost of the TiCN layer and adjacent to the α-Al$_2$O$_3$ layer. Preferably the bonding layer is HTCVD deposited. The bonding layer is to enhance the adhesion between the TiCN layer and the α-Al$_2$O$_3$ layer. The bonding layer is preferably oxidized prior to the α-Al$_2$O$_3$ layer deposition. The thickness of said bonding layer is preferably 0.5-2 μm, most preferably 1-2 μm.

In one embodiment of the present invention the TiCN layer, located between the α-Al$_2$O$_3$ layer and the substrate, exhibits a texture coefficient TC(hkl), as measured by X-ray diffraction using CuKα radiation and θ-2θ scan, defined according to Harris formula (1) where I(hkl) is the measured intensity (integrated area) of the (hkl) reflection, I$_0$(hkl) is the standard intensity according to ICDD's PDF-card No. 42-1489, n is the number of reflections, reflections used in the calculation are (1 1 1), (2 0 0), (2 2 0), (3 1 1), (3 3 1), (4 2 0), (4 2 2) and (5 1 1), wherein TC(2 2 0) is 0.5, preferably 0.3, more preferably 0.2, most preferably 0.1. A low intensity from the (2 2 0) has shown to be advantageous in that it seems to promote a strong <0 0 1> texture of the subsequent α-Al$_2$O$_3$ layer. One way of achieving a low TC(220) is to adjust the volume ratio of TiCl$_4$/CH$_3$CN in an initial part, preferably at the start, of the MTCVD TiCN deposition to a relatively high level.

In one embodiment of the present invention the TiCN layer exhibits a TC(4 2 2)≥3, preferably ≥3.5. In one embodiment of the present invention the TiCN layer exhibits a TC(3 1 1)+TC(4 2 2)≥4, preferably ≥5, more preferably ≥6, most preferably ≥7. These TC values are calculated using the Harris formula (1), the ICDD's PDF-card no 42-1489 and the reflections (1 1 1), (2 0 0), (2 2 0), (3 1 1), (3 3 1), (4 2 0), (4 2 2) and (5 1 1).

In one embodiment of the present invention, the coated cutting tool is subjected to an after treatment common in the art of coated cutting tools, e.g. blasting, brushing etc.

By cutting tool is herein meant an insert, preferably a turning insert.

The coated cutting tool insert is suitably a turning insert for turning in steel, cast iron or stainless steel.

Example 1

Cemented carbide substrates were manufactured by first pre-milling recycled cemented carbide material (PRZ) together with (Ta,Nb)C, (Ti,W)C and Ti(C,N) in a milling liquid of ethanol and water (9 wt % water). The ratio between powder and milling liquid was 232 kg powder/80 L milling liquid in an agitated mill called LMZ10 from Netzsch which is a horizontal agitated mill where the slurry is circulating between the milling chamber and a holding tank. The slurry was milled at 650 rpm to an accumulated energy of 30 kWh.

The amount of PRZ, i.e. recycled material is 20 wt % of the total powder weight. In Table 2, the composition in wt % for the PRZ used is shown, batch no. 828. The rest of the raw materials are added in such amounts so that the composition in Table 1 is obtained.

After the pre-milling step, the WC, Co powders and PEG (poly ethylene glycol), were added to the slurry and milling liquid was added the slurry so that 800 kg powder/160 L milling liquid and all powders was then milled at 650 rpm together to an accumulated energy of 90 kWh.

The amount of PEG was 2 wt % of the total dry powder weight (PEG not included in the total dry powder weight).

The WC powder was a high temperature carburized WC called HTWC040 purchased from Wolfram Bergbau and Hütten AG. The average particle size (FSSS) after ASTM-milling was 3.9 μm.

The slurry was then spray dried into agglomerates which were then subjected to a pressing operation in a hydraulic press from Fette to form green bodies.

The green bodies were then sintered by first performing dewaxing in H2 at up to 450° C., vacuum heating up to 1350° C. After that, a protecting atmosphere of flowing 20 mbar Ar and 20 mbar CO is introduced and then maintaining the temperature at 1450° C. for 1 h.

The cemented carbide achieved is herein after denoted Invention 1.

For comparison, a substrate was manufactured by first manufacture cemented carbide substrate by milling all raw material powders in a conventional ball mill for 11 h, i.e. no pre-milling is performed.

The raw materials were the same as in for Invention 3, with the differences that 15 wt % of the total powder weight of another batch of PRZ was used, batch 757, see Table 2, and that a conventional WC (not high temperature carburized) was used with an average particle size (FSSS) after ASTM-milling of 7.0 μm. The amount of the other raw materials is added in such amounts so that the composition according to Table 1 was achieved.

The cemented carbide achieved is herein after denoted Comparative 1.

TABLE 1

| | Co (wt %) | NbC (wt %) | TaC (wt %) | TiC (wt %) | TiN (wt %) | WC |
|---|---|---|---|---|---|---|
| Invention 1 | 10.00 | 1.35 | 3.55 | 2.62 | 0.38 | Balance |
| Comparative 1 | 10.00 | 1.35 | 3.55 | 2.56 | 0.44 | Balance |

TABLE 2

| Batch | W | Co | Nb | Ta | Ti | Cr | Zr | V | Zn | C | N | O |
|---|---|---|---|---|---|---|---|---|---|---|---|---|
| 828 | 81.5 | 8.83 | 0.66 | 1.58 | 1.04 | 0.079 | 0.022 | 0.007 | 0.001 | 5.73 | 0.06 | 0.17 |
| 757 | 82.1 | 7.99 | 0.62 | 1.68 | 1.31 | 0.13 | 0.045 | 0.012 | 0.001 | 5.74 | 0.06 | 0.22 |

The rest of the PRZ-powder (up to 100%) is trace amounts of Fe, Ni and Al.

The slurry was then spray dried into agglomerates which were then subjected to a pressing operation in hydraulic press from Fette to form green bodies.

The achieved materials, Invention 1 and Comparative 1, both have a binder phase enriched surface zone depleted from gamma phase, with a thickness of 22 and 23 μm respectively.

The cemented carbide substrates were then provided with a coating. First, they were coated with a thin approximately 0.4 μm TiN-layer then with an approximately 7 μm TiCN layer by employing the well-known MTCVD technique using $TiCl_4$, $CH_3CN$, $N_2$, HCl and $H_2$ at 885° C. The volume ratio of $TiCl_4/CH_3CN$ in an initial part of the MTCVD deposition of the TiCN layer was 6.6, followed by a period using a ratio of $TiCl_4/CH_3CN$ of 3.7. The details of the TiN and the TiCN deposition are shown in Table 3.

TABLE 3

| (MTCVD of TiN and TiCN) | | | | | | |
|---|---|---|---|---|---|---|
| MT CVD of TiN and TiCN (885° C.): | Pressure [mbar] | $H_2$ [vol %] | $N_2$ [vol %] | HCl [vol %] | $TiCl_4$ [vol %] | $CH_3CN$ [vol %] |
| TiN | 400 | 48.8 | 48.8 | — | 2.44 | — |
| TiCN inner | 55 | 59 | 37.6 | — | 2.95 | 0.45 |
| TiCN outer | 55 | 81.5 | 7.8 | 7.8 | 2.38 | 0.65 |

On top of the MTCVD TiCN layer was a 1-2 μm thick bonding layer deposited at 1000° C. by a process consisting of four separate reaction steps. First a HTCVD TiCN step using $TiCl_4$, $CH_4$, $N_2$, HCl and $H_2$ at 400 mbar, then a second step (TiCNO-1) using $TiCl_4$, $CH_3CN$, CO, $N_2$ and $H_2$ at 70 mbar, then a third step (TiCNO-2) using $TiCl_4$, $CH_3CN$, CO, $N_2$ and $H_2$ at 70 mbar and finally a fourth step (TiCNO-3) using $TiCl_4$, CO, $N_2$ and $H_2$ at 70 mbar. During the third and fourth deposition step some of the gases were continuously changed as indicated by a first start level and a second stop level presented in Table 4. Prior to the start of the subsequent $Al_2O_3$ nucleation, the bonding layer was oxidized for 4 minutes in a mixture of $CO_2$, CO, $N_2$ and $H_2$. The details of the bonding layer deposition are shown in Table 4.

TABLE 4

| (Bonding layer deposition) | | | | | | | | | |
|---|---|---|---|---|---|---|---|---|---|
| Bonding layer: | Pressure [mbar] | $H_2$ [vol %] | $N_2$ [vol %] | $CH_4$ [vol %] | HCl [vol %] | CO [vol %] | $TiCl_4$ [vol %] | $CH_3CN$ [vol %] | $CO_2$ [vol %] |
| HTCVD TiCN | 400 | 67.9 | 25.5 | 3.4 | 1.7 | — | 1.5 | — | — |
| TiCNO-1 | 70 | 83.7 | 12 | — | 1.2 | 1.2 | 1.5 | 0.4 | — |
| TiCNO-2 | 70 | 63.1-61.7 | 31.5-30.9 | — | — | 1.6-3.7 | 3.15-3.09 | 0.66-0.64 | — |
| TiCNO-3 | 70 | 62.1-61.5 | 31.1-30.8 | — | — | 3.7-4.6 | 3.11-3.08 | — | — |
| Oxidation | 55 | 53.8 | 30 | — | — | 12.5 | — | — | 3.7 |

On top of the bonding layer an α-Al$_2$O$_3$ layer was deposited. All the α-Al$_2$O$_3$ layers were deposited at 1000° C. and 55 mbar in two steps. The first step using 1.2 vol-% AlCl$_3$, 4.7 vol-% CO$_2$, 1.8 vol-% HCl and balance H$_2$ giving about 0.1 μm α-Al$_2$O$_3$ and the second step of the α-Al$_2$O$_3$ layer was deposited using 1.2% AlCl$_3$, 4.7% CO$_2$, 2.9% HCl, 0.58% H$_2$S and balance H$_2$.

Example 2 (Texture Analysis)

XRD was used to analyse the TC values of the α-Al$_2$O$_3$ and the TiCN in accordance with the method as disclosed above. The layer thicknesses were analysed in a light optical microscope by studying a cross section of each coating at 1000× magnification and both the bonding layer and the initial TiN layer are included in the TiCN layer thickness given in Table 5. In Table 5, the reference, Comparative 1, is also included which is a commercial grade GC4235. Two samples of Invention 1 and Comparative 1, respectively, were analysed. The results are presented in Table 5.

TABLE 5

| | (Thickness and diffraction data) | | | | | | |
|---|---|---|---|---|---|---|---|
| Sample | Layer thickness TiCN [μm] | Layer thickness α-Al$_2$O$_3$ [μm] | TC (0 0 12) of α-Al$_2$O$_3$ | I (0 0 12)/ I (0 1 14) of α-Al$_2$O$_3$ | TC (4 2 2) of TiCN | TC (3 1 1) of TiCN | TC (2 2 0) of TiCN |
| Inv. 1a | 9.6 | 4.6 | 7.6 | 1.5 | 3.69 | 2.04 | 0.15 |
| Inv. 1b | | | 7.7 | 1.7 | 4.08 | 2.07 | 0.10 |
| Comp. 1a | 8.3 | 4.7 | 6.7 | 0.7 | 2.26 | 1.72 | 0.71 |
| Comp. 1b | | | 6.9 | 0.8 | 2.30 | 1.64 | 0.83 |

The inserts according to the present invention were blasted on the rake faces in a wet blasting equipment using a slurry of alumina in water and the angle between the rake face of the cutting insert and the direction of the blaster slurry was about 90°. The alumina grits were F220, the pressure of slurry to the gun was 1.8 bar, the pressure of air to the gun was 2.2 bar, the average time for blasting per area unit was 4.4 seconds and the distance from the gun nozzle to the surface of the insert was about 145 mm. The aim of the blasting is to influence the residual stress in the coating and the surface roughness and thereby improve the properties of the inserts in the subsequent turning test.

Example 3 (Microstructure)

The microstructure of the substrate was also analyzed by EBSD. 4 images of 60*100 μm were used.

The inserts were prepared for electron backscatter diffraction (EBSD) characterization by polishing the cross section of the bulk material using mechanical polishing using a diamond slurry down to a diamond size of 1 μm followed by an ion polished step performed in an Hitachi E3500.

The prepared samples were mounted onto a sample holder and inserted into the scanning electron microscope (SEM). The samples were tilted 70° with respect to the horizontal plane and towards the EBSD detector. The SEM used for the characterization was a Zeiss Supra 55 VP, using a 240 μm objective aperture, applying "High current" mode and operated in high vacuum (HV) mode. The used EBSD detector was an Oxford Instruments Nordlys Detector operated using Oxford Instruments "AZtec" software version 3.1. EBSD data acquisitions were made by applying a focused electron beam on to the polished surfaces and sequentially acquiring EBSD data using a step size of 0.1 μm for 1000×600 μm measuring points. When performing EBSD analysis for this purpose, the number of images should be chosen so that the total area from which the EBSD data is obtained from should be at least 12000 μm$^2$.

| The SEM settings | |
|---|---|
| Acceleration Voltage | 20 kV |
| Aperture Size | 240 μm |
| High current | On |
| Working distance | 8.5 mm |
| Detector insertion distance | 171 mm |
| Grouping | Group 1: Co (cubic) + Cubic carbide phase |
| Optimize Pattern | |
| Binning | 2 × 2 |
| Gain | 15 |
| Frame Average | 2 |
| Number of frames | 200 |
| Static Background | On |
| Auto Background | On |
| Optimize Solver | |
| Number of Bands | 9 |
| Hough Resolution | 90 |
| Detect | Edges |
| Advanced Fit | Off |
| Apply refinement | On |

Reference phases were:
WC (hexagonal), 59 reflectors, Acta Crystallogr., [AC-CRA9], (1961), vol. 14, pages 200-201 Co (cubic), 68 reflectors, Z. Angew. Phys., [ZAPHAX], (1967), vol. 23, pages 245-249 Co (hexagonal), 50 reflectors, Fiz. Met. Metalloved, [FMMTAK], (1968), vol. 26, pages 140-143

Cubic carbide phase, TiC, 77 reflectors, J. Matter. Chem. [JMACEP], (2001), vol. 11, pages 2335-2339 reflectors Since these cemented carbides comprises two cubic phases, Co binder phase and gamma phase, care has to be taken that the phases are identified correctly, i.e. that the indexing is accurate. This can be done in several ways, one way is to, on the same sample, also do an EDS or backscatter image, which depends on the chemical composition of the phases and thereby shows the difference between the binder and the gamma phase, for comparison.

The EBSD data was collected in AZtec and analyzed in HKL Channel 5 (HKL Tango version 5.11.20201.0), by Oxford instruments. Noise reduction was performed by removing wild spikes and performing zero solution extrapolation level 5. WC grains were determined with a critical misorientation angle of 5 degrees. Grain boundaries between the gamma phase grains were eliminated so that only the gamma phase particles were analyzed. This was done in Channel 5 by setting the critical misorientation to 90 degrees. All particles of less than 4 pixels (0.04 $\mu m^2$) were eliminated as noise.

The distribution of the gamma phase is determined by EBSD analysis and is given by the value N ($\mu m^2$), where:

$$N = X/Y$$

The cumulative relative particle area of the gamma phase particles (y-axis) from the EBSD analysis is plotted against the particle area (x-axis). From the cumulative plot, the particle area (x-axis) at the cumulative relative area of 0.90 (y-axis), value X ($\mu m^2$), is achieved. If no value matches 0.90 exactly, an average of the two values below and above 0.90 is used as X.

The value Y is a correction factor to correlate for different amounts of gamma phase in the cemented carbide. Y is the ratio between the area fraction of cubic carbides and cubic carbonitrides (gamma phase) divided by the total amount of carbides and carbonitrides, i.e. both WC (hexagonal) and gamma phase (cubic). The area fractions are obtained from the EBSD data.

$$Y = \frac{\text{area fraction of cubic carbides and cubic carbonitrides}}{\text{area fraction of total carbides and carbonitrides}}$$

The area fraction of abnormal WC grains is defined as the area fraction of the WC grains that is larger than 10 times the average area for the WC grains, $aWC_{av}$, related to the total area of WC grains.

$$\text{area fraction abnormal grains} = \frac{\text{total area of all } WC \text{ grains} > 10 \times aWC_{av}}{\text{total area of all } WC \text{ grains}}$$

For comparison, a commercial grade, GC4235, suitable for turning in steel was also analyzed in the same way. GC4235 is herein called Comparative 1.

The results from the measurements can be seen in Table 6 below.

In Table 6, the Coercivity (Hc) and the weight specific magnetic saturation magnetism is also given.

The coercivity and the weight specific magnetic saturation magnetism were measured using a Foerster Koerzimat CS1.096.

TABLE 6

|  | Hc (kA/m) | weight specific magnetic saturation magnetism ($10^{-6} Tm^3/kg$) | Area fraction of abnormal WC grains | Gamma phase distribution, N, ($\mu m^2$) |
| --- | --- | --- | --- | --- |
| Invention 1 | 11.66 | 16.9 | 0.0139 | 66.6 |
| Comparative 1 | 11.55 | 16.5 | 0.0458 | 108.4 |

Example 4 (Working Example)

The insert made according to Example 1, Invention 1, was tested together with Comparative 1 in a facing operation under dry conditions. The work piece material was steel, SS2541, with the following conditions:

| $v_C$ | 160 m/min |
| --- | --- |
| f | 0.3 mm/rev |
| $a_p$ | 2 mm |

Tool life criterion: Vb≥0.5 mm on the main cutting edge. The results are shown in Table 7.

TABLE 7

|  | Average Tool Life (min) |
| --- | --- |
| Invention 1 | 82 |
| Comparative 1 | 53 |

As can be seen in table 7, the insert according to the present invention shows an improved resistance against plastic deformation of the cutting edge compared to the reference.

Example 5 (Working Example)

The insert described in Example 1, invention 1, was tested together with Comparative 1 in a turning operation under wet conditions. The work piece is constructed so that there are two intermittent occasions per revolution. The work piece material was carbon steel, SS1312, with the following conditions:

| $v_C$ | 50 m/min |
| --- | --- |
| f | 0.6 mm/rev |
| $a_p$ | 1.5 mm |

Tool life criterion: Fracture without any other major wear. The results are shown in Table 8 below where the tool life is an average of 8 tests.

TABLE 8

|  | Average Tool Life (min) |
| --- | --- |
| Invention 1 | 8.8 |
| Comparative 1 | 4.7 |

As can be seen in Table 8, the insert according to the present invention shows an improved toughness behavior compared to the reference.

The invention claimed is:
1. A coated cutting tool comprising:
   a cemented carbide substrate; and
   a coating, wherein the cemented carbide substrate comprises WC, a cobalt binder phase and gamma phase, wherein the cemented carbide substrate includes a binder phase enriched surface zone depleted of gamma phase where a thickness of the surface zone is between 14 and 26 μm, and where the cemented carbide has a well distributed gamma phase N less than 80 μm$^2$, where

$N=X/Y$ wherein X (μm$^2$) is a particle area (x-axis) at a cumulative relative area of 0.90 (y-axis), in a cumulative plot, obtained from EBSD analysis, wherein the cumulative relative particle area of the gamma phase particles (y-axis) is plotted against the particle area (x-axis) and where Y is a correction factor:

$$Y = \frac{\text{area fraction of cubic carbides and cubic carbonitrides}}{\text{area fraction of total carbides and carbonitrides}}$$

where area fractions are obtained from EBSD analysis and where the area fraction obtained from EBSD analysis of abnormal WC grains is defined as:

$$\text{area fraction abnormal grains} = \frac{\text{total area of all } WC \text{ grains} > 10 \times aWC_{av}}{\text{total area of all } WC \text{ grains}}$$

wherein the area fraction is between 0 and 0.03, and wherein the coating includes a α-Al$_2$O$_3$ layer and between said substrate and said α-Al$_2$O$_3$ layer the coating includes a TiCN-layer, wherein said α-Al$_2$O$_3$ layer exhibits a texture coefficient TC(hkl), as measured by X-ray diffraction using CuKα radiation and θ-2θ scan, defined according to Harris formula:

$$TC(hkl) = \frac{I(hkl)}{I_0(hkl)} \left[ \frac{1}{n} \sum_{n=1}^{n} \frac{I(hkl)}{I_0(hkl)} \right]^{-1}$$

where I(hkl) is a measured intensity (integrated area) of the (hkl) reflection,
   I$_0$(hkl) is a standard intensity according to ICDD's PDF-card No. 00-010-0173, n is a number of reflections used in the calculation, and where (hkl) reflections used are (1 0 4), (1 1 0), (1 1 3), (024), (1 1 6), (2 1 4), (3 0 0) and (0 0 12), wherein TC(0 0 12)≥7.2, and wherein the ratio of I(0 0 12)/I(0 1 14)≥1.

2. The coated cutting tool according to claim 1, wherein the amount of gamma phase is between 3 to 25 vol %.

3. The coated cutting tool according to claim 1, wherein the area fraction of abnormal WC grains is between 0 to 0.025.

4. The coated cutting tool according to claim 1, wherein the gamma phase distribution, N, is between 15 to 75 μm$^2$.

5. The coated cutting tool according to claim 1, wherein a thickness of said TiCN layer is 4-20 μm.

6. The coated cutting tool according to claim 1, wherein a thickness of said α-Al$_2$O$_3$ layer is 2-20 μm.

7. The coated cutting tool in accordance with claim 1, wherein the coating further comprises a bonding layer comprising TiN, TiCN, TiCNO and/or TiCO or a combination thereof, the bondying layer being located outermost of the TiCN layer and adjacent to the α-Al$_2$O$_3$ layer.

8. The coated cutting tool in accordance with claim 7, wherein a thickness of the bonding layer is 0.5-2 μm.

9. The coated cutting tool in accordance with claim 1, wherein the TiCN layer located between the α-Al$_2$O$_3$ layer and the substrate exhibits a texture coefficient TC(hkl), as measured by X-ray diffraction using CuKα radiation and θ-2θ scan, defined according to the Harris formula where I(hkl) is the measured intensity (integrated area) of the (hkl) reflection, I$_0$(hkl) is the standard intensity according to ICDD's PDF-card No. 42-1489, and the number of reflections, reflections n used in the calculation are (1 1 1), (2 0 0), (2 2 0), (3 1 1), (3 3 1), (4 2 0), (4 2 2) and (5 1 1), wherein TC(2 2 0) is ≤0.5.

10. The coated cutting tool in accordance with claim 9, wherein the TiCN layer exhibits a TC(4 2 2)≥3.

11. The coated cutting tool in accordance with claim 9, wherein the TC(3 1 1)+TC(4 2 2) of the TiCN layer is ≥4.

* * * * *